US012733208B2

(12) United States Patent
Chang et al.

(10) Patent No.: US 12,733,208 B2
(45) Date of Patent: Sep. 8, 2026

(54) METHODS FOR FORMING DEVICES WITH SHALLOW SOURCE/DRAIN CONTACTS

(71) Applicant: Taiwan Semiconductor Manufacturing Co., Ltd., Hsinchu (TW)

(72) Inventors: Chia-Hao Chang, Hsinchu (TW); Jia-Chuan You, Hsinchu (TW); Yu-Chun Liu, Hsinchu (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 631 days.

(21) Appl. No.: 18/168,271

(22) Filed: Feb. 13, 2023

(65) Prior Publication Data

US 2024/0274675 A1 Aug. 15, 2024

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |

(Continued)

(52) U.S. Cl.

CPC ....... *H10D 30/6729* (2025.01); *H10D 30/014* (2025.01); *H10D 30/031* (2025.01); *H10D 30/43* (2025.01); *H10D 64/01* (2025.01); *H10D 84/0186* (2025.01); *H10D 84/038* (2025.01); *H10D 84/85* (2025.01); *H10D 30/6735* (2025.01); *H10D 62/121* (2025.01)

(58) Field of Classification Search

CPC ............. H10D 30/6729; H10D 30/014; H10D 30/031; H10D 30/43; H10D 64/01; H10D 84/0186; H10D 84/038; H10D 84/85; H10D 30/6735; H10D 62/121; H10D 30/6757; H10D 62/151; H10D 84/83

See application file for complete search history.

(56) References Cited

U.S. PATENT DOCUMENTS

| | | | | |
|---|---|---|---|---|
| 2017/0117380 | A1* | 4/2017 | Lu | H10D 30/024 |
| 2021/0305246 | A1* | 9/2021 | Huang | H10D 30/024 |
| 2021/0376095 | A1* | 12/2021 | Chen | H10D 30/6219 |

* cited by examiner

*Primary Examiner* — Norman D Richards
*Assistant Examiner* — Ethan Edward Cutler
(74) *Attorney, Agent, or Firm* — Seed Intellectual Property Law Group LLP

(57) ABSTRACT

The present disclosure is generally related to semiconductor devices, and more particularly to field-effect transistors (FETs). A substrate includes fin-like protruding portions in which source/drain regions are formed on the fin-like protruding portions of the substrate. The source/drain regions are laterally adjacent and electrically coupled to the nanostructure channels. A dielectric material is partially filling spaces between the fin-like protruding portions and partially are coupled to the source/drain regions. A barrier layer is on the dielectric material and covers portions of the source/drain regions. A source/drain contact is formed in the barrier layer and is partially in contact with the source/drain regions. The barrier layer and the dielectric material that formed below the MD contact in spaces between the source/drain regions result in a reduction of parasitic capacitance of the metal contacts such as gate-drain capacitance ($C_{gd}$).

20 Claims, 11 Drawing Sheets

(51) Int. Cl.
*H10D 84/03* (2025.01)
*H10D 84/85* (2025.01)

METHODS FOR FORMING DEVICES WITH SHALLOW SOURCE/DRAIN CONTACTS

BACKGROUND

By advancement of nano- and micro-fabrication technologies in semiconductor integrated circuits (ICs), scaling down dimensions of semiconductor devices benefits new generations of ICs. In general, a functional density of an IC, that is introduced based on number of interconnected devices per a chip area, depends on a geometry size of the IC based on the fabrication process. The geometry size is defined by minimum size of a line or component that can be created in the respective fabrication process. Scaling down the components size, known as "scaling," enhances the geometry size, and consequently increases functional density of the IC. Accordingly, efficiency and cost of production process can be enhanced by scaling.

In particular, the scaling benefits IC technology in static random access memory (SRAM), where the performance of SRAMs are enhanced by scaling semiconductor devices such as fin-like field effect transistors (FinFET) and gate-all-around (GAA) transistors. These types of transistors incorporate multiple gates into a single semiconductor device while a single gate controls the multiple gates. In some recent designs of GAA-FinFET, multiple gates are formed as a nanostructure, including stacked metal layers and a fin-like gate that surrounds all sides of a vertical semiconductor channel.

BRIEF DESCRIPTION OF THE DRAWINGS

Aspects of the present disclosure are best understood from the following detailed description when read with the accompanying figures. It is noted that various features are not drawn to scale.

DETAILED DESCRIPTION

Figure 1A:
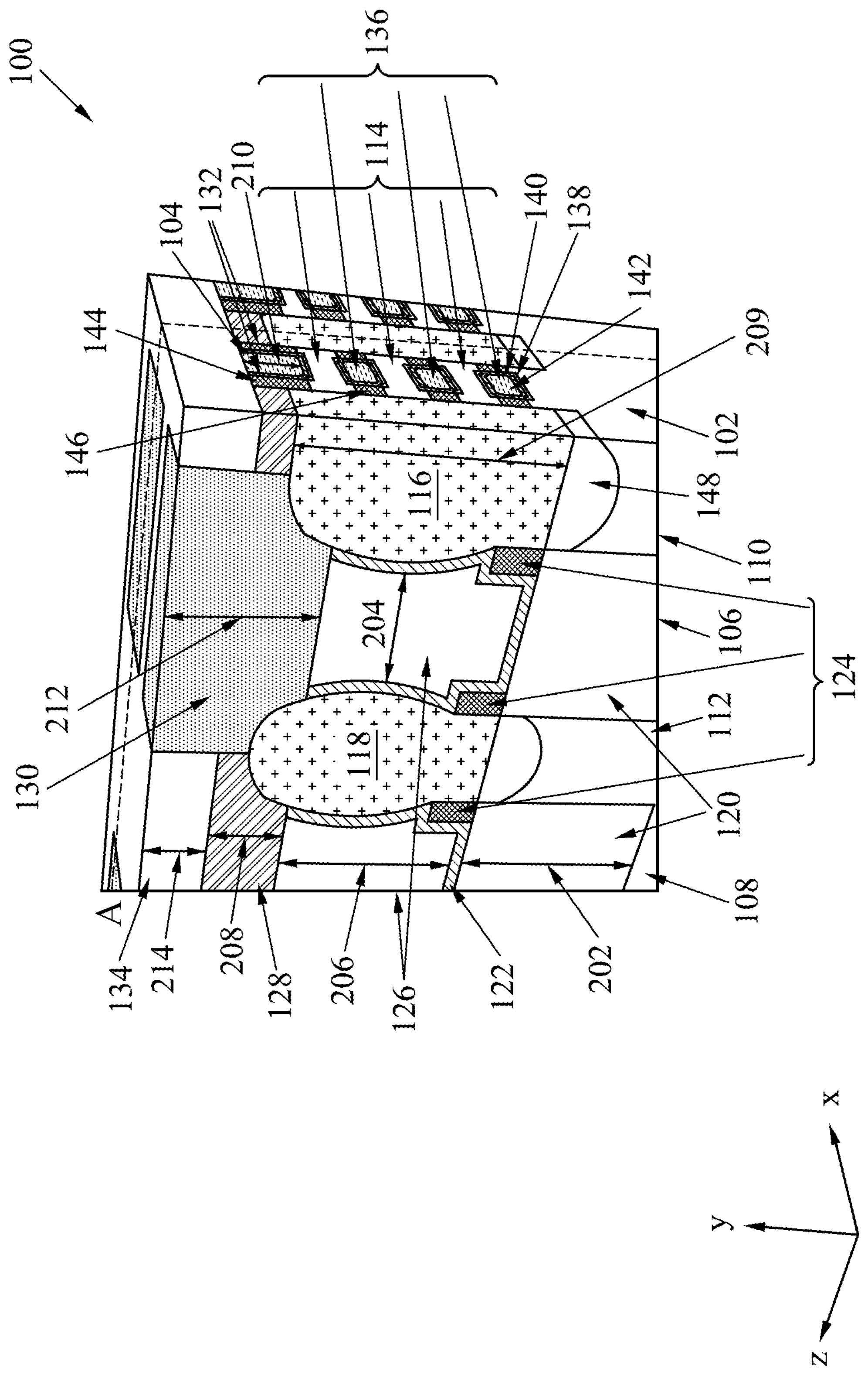
FIG. 1A is a three-dimensional view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin-line FETs (FinFETs), or nanostructure devices. Examples of nanostructure devices include gate-all-around (GAA) devices, nanosheet FETs (NSFETs), nanowire FETs (NWFETs), and the like. In advanced technology nodes, dimension scaling can lead to difficulties forming contacts and vias to the gate, source and drain electrodes of the FETs.

Nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

In various embodiments, each device includes a gate electrode and a gate dielectric surrounding the gate electrode. In some examples, the gate electrode at least partially surrounds a nanostructure, which may operably form a channel region of a transistor. The nanostructure may include stacked semiconductor nanosheets. The gate dielectric may be formed by a high-k (HK) material. In some examples, the HK material covers sidewalls of the gate electrode in a direction aligned to adjacent devices. In some embodiments, a substrate includes fin-like protruding portions in which source/drain regions are formed on the fin-like protruding portions of the substrate. The source/drain regions are laterally adjacent and electrically coupled to the nanostructure channels. A dielectric material is partially filling spaces between the fin-like protruding portions and partially are coupled to the source/drain regions. A barrier layer is on the dielectric material and covers portions of the source/drain regions. A source/drain contact is formed in the barrier layer and is partially in contact with the source/drain regions. The source/drain contact forms a metal-to-device (MD) contact without any vias. The barrier layer and the dielectric material that formed below the MD contact in spaces between the source/drain regions result in a reduction of parasitic capacitance of the metal contacts such as gate-drain capacitance ($C_{gd}$). In various embodiments, a contact resistance of the source/drain regions ($R_{csd}$) is adjustable by changing a vertical dimension of the barrier layer and the dielectric material.

FIG. 1A is a three-dimensional view of a device 100. The device 100 shown in FIG. 1A may represent only a portion of a semiconductor device, for example, the device 100 may have a repeated structure such that the device can be repeated (e.g., along the x-axis, the z-axis or any other direction) to create an integrated circuit (IC) after finalizing manufacturing processes. In some examples, the semiconductor device may include one or more transistors, which in some embodiments may be fin-like field effect transistors (FinFET) or gate-all-around (GAA) transistors. The dotted line A in FIG. 1A shows the boundary of the semiconductor device 100 that can be repeated along the x-axis to form the plurality of semiconductor devices.

In some embodiments, the semiconductor device 100 includes a plurality of devices, such as one or more transistors, formed on a semiconductor substrate 102. The device 100 includes a gate electrode 104 which may extend along a direction (e.g., along the z-axis as shown, where the z-axis is transverse to the x-axis). A plurality of isolation trenches, e.g., 106 and 108, are formed into the substrate 102. The plurality of trenches may have the same depth that extends, for example, along the y-axis and the same width that extends along the z-axis, as shown. The plurality of trenches forms a plurality of vertical structures (e.g., along the y-axis) and may be repeated along a transverse direction (e.g., along the z-axis). For example, the trenches 106, 108 may define a plurality of fin-like protruding portions 110, 112 in the substrate 102. Various embodiments may include any number of trenches and vertical structures which may be selectively designed based on the desired working function of the device or transistor properties such as channel width. Only two trenches 106, 108 are shown in FIG. 1A for simplicity. The vertical structures and the trenches can be symmetrical, e.g., along the z-axis. Thus, properties of the cross-sectional cut along the x-y plane may be the same for other vertical structures along the z-axis.

Each of the transistors of the semiconductor device 100 may include at least one nanostructure, which may be disposed on or over a respective vertical fin-like protruding portions 110, 112. In some embodiments, as shown in FIG. 1A, each of the vertical fin-like protruding portions 110, 112 may include three nanostructures 114 along the y-axis. The transistors further include source/drain regions 116, 118, which may be formed of any suitable material, such as a semiconductor material in some embodiments. In some embodiments, the source/drain regions 116, 118 may be epitaxial structures formed by epitaxial growth of a semiconductor material. The nanostructures 114 may form channel regions of the transistors of the semiconductor device 100, with each transistor including one or more nanostructures 114 forming a channel that extends between neighboring source/drain regions 116, 118. Source/drain region(s) may refer to a source or a drain, individually or collectively dependent upon the context. In some embodiments, the epitaxial structure of the source/drain regions 116, 118 may include a different epitaxial structure in portions which is in a physical contact with the semiconductor material of the substrate 102 and the nanostructures 114 (indicated by dashed line boundaries of the source/drain regions 116, 118). In addition, a dopant concentration of the epitaxial structure of the source/drain regions 116, 118 may have different profile in portions which is in a physical contact with the semiconductor material of the substrate 102 and the nanostructures 114.

Each of the trenches 106, 108 are partially filled with a dielectric material 120. First portions of each of the trenches 106, 108 are partially filled with the dielectric material 120 having a height 202 along the y-axis. The dielectric material 120 inside the trenches 106, 108 provides isolation between the fin-like protruding portions 110, 112 as well as isolation between the gate electrode 104 and substrate 102. In various embodiments, the dielectric material 120 forms shallow trench isolation (STI) structures, deep trench isolation (DTI) structures, and/or local oxidation of silicon (LOCOS) structures.

A liner 122 is formed over the dielectric material 120 and is extended along the z-axis for each of the trenches 106, 108. The liner 122 surrounds source/drain regions 116, 118. The liner 122 may form a contact etch stop layer (CESL). A bottom surface of the liner 122 inside each of the trenches 106, 108 along the y-axis has protrusions due to existence of fin spacers 124. The fin spacers 124 are located at the top of the dielectric material 120 which makes a corner with the source/drain regions 116, 118. The presence of the fin spacers 124 causes portions of the dielectric material 120 under the fin spacers 124 to remain after strained source/drain regions 116, 118 and dielectric material 120 etching.

A dielectric material 126 is formed in the space between the source/drain regions 116, 118 over the liner 122. In various embodiments, the dielectric material 126 is the same as the dielectric material 120. The source/drain regions 116, 118 regions have a convex shape in the trenches 106, 108 area along the z-axis. Thus, the dielectric material 126 has a concave shape in the spaces between the source/drain regions 116, 118 along the z-axis. A minimum distance between the source/drain regions 116, 118 determines source/drain space 204. In some embodiments, the source/drain space 204 is about 5 nm to 150 nm. The dielectric material 126 has a height 206 in the y-axis that is about 5 nm to 100 nm.

A barrier layer 128 is formed on the dielectric material 126 and the source/drain regions 116, 118. The barrier layer 128 is extended along the z-axis for each of the trenches 106, 108, except for the portions that are removed to form a source/drain contact 130 (e.g., MD contact). The barrier layer 128 may be a contact etch stop layer (CESL). In addition, the barrier layer 128 is extended over or along sidewalls 132 of the gate electrode 104. In various embodiments, the barrier layer 128 includes the same material as the liner 122. The barrier layer 128 has a height 208 in the y-axis that is about 5 nm to 100 nm. In some examples, the height 206 is greater than the height 208, and a height 209 of the source/drain regions 116, 118 is greater than the height 206. In some embodiments, a contact resistance of the source/drain regions 116, 118, such as $R_{csd}$, depends on the heights 206 and 208. In this condition, by a design of the heights 206 and 208, the contact resistance can be adjusted to a desired value.

In some embodiments, the gate electrode 104 has a height 210 over the nanostructures 114 along the y-axis. The nanostructures 114 are surrounded by the gate electrode 104, where the gate electrode 104 is extended inside the trenches 106, 108. In some examples, a portion of the gate electrode 104 inside the trenches 106, 108 may have a height substantially the same as the height 209 in addition to the height 208, that is greater than the height 210.

A dielectric material 134 covers the barrier layer 128 and the gate electrode 104 in the y-axis. In some embodiments, the dielectric material 126 forms a first interlayer dielectric (ILD-0), while the dielectric material 134 forms a second interlayer dielectric (ILD-1). In some examples, material of the dielectric material 134 may be the same as material of the dielectric material 126 and 120.

In some embodiments, the liner 122 and the barrier layer 128 as well as the dielectric materials 120, 126, 134 may include a low-k material such as SiOCN, SiON, SIN, SiCN, and SiOC. Alternatively, the liner 122 and the barrier layer 128 as well as the dielectric materials 120, 126 may include aluminum silicate (AlySiOx) or silicide material such as TiSi, TiNiSi, NiSi, WSi, CoSi, or the like. In some examples, the liner 122 and the barrier layer 128 include a dielectric of the metal or a dielectric of the silicide material, such as TiN, TiNiN, NiN, WN, CON, the like or TiSiN, TiNiSiN, NiSiN, WSiN, CoSiN, or the like. The dielectrics just described are nitrides of the metal or silicide material. In some embodiments in which the liner 122 and the barrier layer 128 include carbon or oxygen, the dielectric materials 120, 126, 134 may also include carbon or oxygen. For example, the liner 122 may include TiSiON, TiCN, or the like. In some embodiments, thickness of the liner 122 may be in a range of about 3 nm to about 10 nm.

Gate structures 136 are disposed over and between the nanostructures 114, respectively. In some embodiments, the gate structures 136 are disposed over and between the nanostructures 114. The nanostructures 114 are silicon channels for N-type devices or silicon germanium channels for P-type devices. In some embodiments, the gate structures 136 include an interfacial layer (IL) 138, one or more gate dielectric layers 140, and a metal fill layer (core layer) 142, which are shown and described in greater detail with reference to FIG. 1B.

The source/drain regions 116, 118 may include SiB, SiGe, SiGeB, and may include dopants, such as Ge, Sb, B, or the like. In some embodiments, the source/drain regions 116, 118 include silicon phosphorous (SiP). In some embodiments, the source/drain regions 116, 118 have width in the x-axis in a range of about 0.5 nm to about 100 nm. In some embodiments, height of the source/drain regions 116, 118 in the y-axis is in a range of about 0.1 nm to about 100 nm. The height of the source/drain regions 116, 118 may be measured from an interface between a respective source/drain regions 116, 118 and the fin-like protruding portions 110, 112 on which it is disposed to a top of the source/drain regions 116, 118. In some embodiments, the fin-like protruding portions 110, 112 are not present, for example, when backside structure of the device 100 are removed for forming a backside interconnect structure.

The nanostructures 114 may include gate spacers 144 and inner spacers 146 that are disposed on sidewalls of the gate dielectric layers 140. The inner spacers 146 are also disposed between the nanostructures 114. The gate spacers 144 and the inner spacers 146 may include a dielectric material, for example a low-k material such as SiOCN, SiON, SiN, SiCN or SiOC. In some embodiments, one or more additional spacer layers are present abutting the gate spacers 144. In some embodiments, thickness of the inner spacers 146 in the x-axis is in a range of about 3 nm to about 10 nm. In some embodiments, thickness of the gate spacers 144 in the x-axis is in a range of about 3 nm to about 10 nm. The channel regions may include bottom isolation structures 148 that are beneath the source/drain regions 116, 118. In some embodiments, the bottom isolation structures 148 include a material such as SiOCN, SiON, SiN, SiCN or SiOC, and have a thickness in the y-axis of about 3 nm to about 10 nm. The bottom isolation structures 148 are optional, and are not present in some embodiments.

In various embodiments, the device 100 includes the source/drain contact 130 to couple the source/drain regions 116, 118 to an external circuit (e.g., an external terminal to apply or read electrical potential and current from the device 100). The source/drain contact 130 is formed in the barrier layer 128 and the dielectric material 134. The source/drain contact 130 stops over the dielectric material 126, while is partially in contact with the source/drain regions 116, 118. In some embodiments, the source/drain regions 116, 118 are recessed in portions that are in contact with the source/drain contact 130, thus the source/drain contact 130 is partially embedded in the source/drain regions 116, 118. The source/drain contact 130 has a height 212 in the y-axis. In some embodiments, the height 212 is substantially the same as a summation of the height 208 and a height 214 of the dielectric material 134. In this condition, presence of the barrier layer 128 provides the opportunity to selectively etch on opening inside the dielectric material 134 and the barrier layer 128 for forming the source/drain contact 130, while the dielectric material 126 remains unetched. For instance, for forming the opening, a first step of etching may remove the dielectric material 134 and a second etching may remove the barrier layer 128 and stop at the interface of the dielectric material 126. More detail of the etching process is described in FIGS. 2A-4B.

As a result of the selectively etching of the dielectric material 134 and the barrier layer 128, the source/drain contact 130 forms a coplanar layer with a combination of the dielectric material 134 and the barrier layer 128 along the y-axis. Thus, the source/drain contact is not penetrating inside the dielectric material 126, while the barrier layer 128 forms a contact etch stop layer (CESL) on the dielectric material 126 in the y-axis. A parasitic capacitance of the device 100, which typically is undesirable in an electrical circuit operation, relates to an area of the conductive material in the device 100. The source/drain contact 130 is one of the conductive materials which causes a parasitic capacitance such as the gate-drain capacitance ($C_{gd}$). Hence, the use of the barrier layer 128 to stop penetration of the source/drain contact 130 inside the dielectric material 126 results in a reduction of the area of conductive material of the device 100, and consequently reduces the parasitic capacitance of the device 100. In addition, the barrier layer 128 may include a dielectric material which causes higher electrical isolation than the dielectric material 134. In this condition, presence of the barrier layer 128 reduces an electrical leakage between the adjacent contacts and consequently reduces the parasitic capacitance through the reduction of the electrical leakage.

The gate electrode 104 has a portion extended in the y-axis inside the trenches 106, 108 behind the dielectric material 126 (not visible in FIG. 1A). In some structures in absence of the barrier layer 128, the conductive material of the source/drain contact 130 is extended in the y-axis inside the dielectric material 126 until the bottom surface of the liner 122. In this condition, the surface of the source/drain contact 130 and the gate electrode 104 form parallel plates coupled together in the x-axis. The parallel plate of the conductive material creates the gate-drain capacitance $C_{gd}$. This capacitance limits some performance parameters of the device 100, such as speed and frequency of the device working in a digital mode. The value of the capacitance $C_{gd}$ depends on the area of the parallel plate and dielectric material therebetween. Reduction of the value of capacitance $C_{gd}$ is a desired design goal which can enhance the performance of the device 100. Thus, reducing the area of the conductive material reduces the capacitance value and enhances the performance of the device 100. In the present embodiment, the source/drain contact 130 is stopped at the interface of the barrier layer 128 and the dielectric material 126 in the y-axis. Therefore, forming an extended portion of the source/drain contact 130 inside the dielectric material 126 is eliminated. Consequently, the area of the parallel plate of the conductive material is reduced that reduces the value of the capacitance $C_{gd}$.

In some embodiments, the source/drain contact 130 may include a conductive material such as tungsten, ruthenium, cobalt, copper, molybdenum, or the like. The source/drain contacts 130 have an aspect ratio (e.g., height/width) in a range of about 1 to about 8. When the aspect ratio is over about 8, voids occurring when forming the source/drain contacts 130 may not be completely removed, and may be present in the source/drain contacts 130.

In some embodiments, a silicide layer (not shown) may also be formed between the source/drain regions 116, 118 and the source/drain contacts 130, to reduce the source/drain contact resistance. In some embodiments, the silicide layer may include one or more of nickel, cobalt, titanium, tantalum, platinum, tungsten, other noble metals, other refractory metals, rare earth metals or their alloys. For example, the silicide layer may be TiSi, TiNiSi, NiSi, WSi, CoSi, MoSi, RuSi, or the like. In some embodiments, height 212 of the source/drain contacts 130 may be in a range of about 1 nm to about 100 nm, such as about 10 nm to about 100 nm.

Figure 1B:
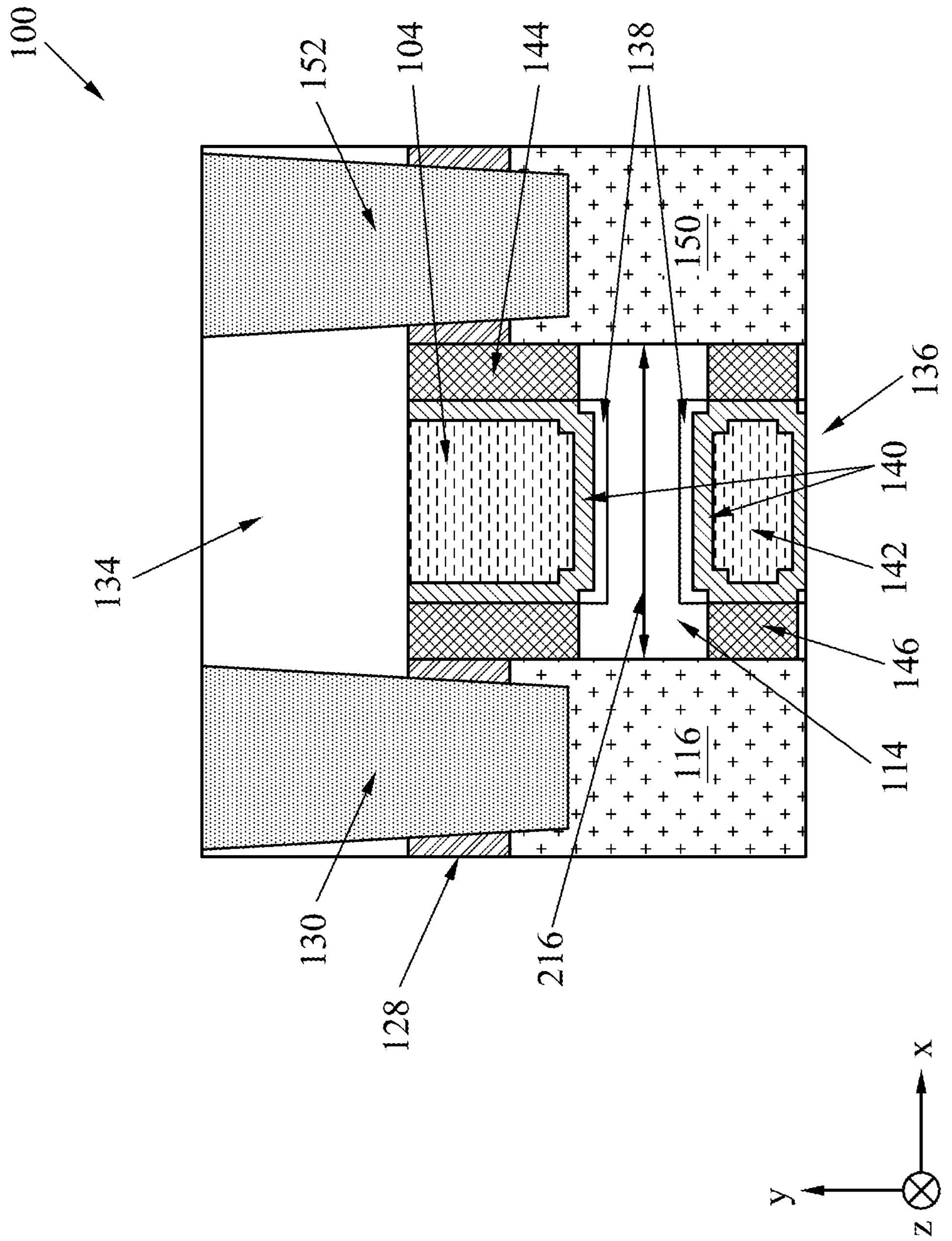
FIG. 1B is a cross-sectional view of the semiconductor device in FIG. 1A, in accordance with some embodiments.

FIG. 1B is a cross-sectional view of the device 100 in FIG. 1A. This cross-sectional view shows more detail of the dielectric layers, the nanostructure, and the contacts. In some embodiments, three nanostructures 114 are stacked or overlie or overlap one another along the y-axis. In some examples, the number of stacked nanostructures 114 may be more or less than three. In some embodiments, each of the nanostructures 114 is at least partially surrounded by the gate electrode 104. For example, in some embodiments, the gate electrode 104 surrounds at least four sides of each of the nanostructures 114. The nanostructures 114 are coupled between the source/drain region 116 and a source/drain region 150 along the x-axis. In some examples, the nanostructure 114 is a semiconductor nanosheet, which may be formed by any suitable semiconductor material. Semiconductor layers of the semiconductor nanosheets may be the same as the semiconductor substrate 102 (e.g., silicon). In some examples, semiconductor materials in the semiconductor nanosheets may be doped with desired dopants to form channel regions of transistors. The nanostructures 114 are silicon channels for N-type devices or silicon germanium channels for P-type devices.

The gate structure 136 shown in FIGS. 1A and 1B includes the interfacial layer 138, the gate dielectric layer 140, and the core layer 142. The interfacial layer 138, which may be an oxide of the material of the nanostructures 114, is formed on exposed areas of the nanostructures 114 and the top surface of the substrate 102 when present. The interfacial layer 138 promotes adhesion of the gate dielectric layers 140 to the nanostructures 114. In some embodiments, the interfacial layer 138 has a thickness of about 5 Angstroms (A) to about 50 Angstroms (A). In some embodiments, the interfacial layer 138 has thickness of about 10 A. The interfacial layer 138 having thickness that is too thin may exhibit voids or insufficient adhesion properties. The interfacial layer 138 being too thick consumes gate fill window, which is related to threshold voltage tuning and resistance as described above. In some embodiments, the interfacial layer 138 is doped with a dipole, such as lanthanum, for threshold voltage tuning.

The gate dielectric layer 140 is positioned between the interfacial layer 138 and the core layer 142. In some embodiments, the gate dielectric layer 140 includes at least one high-k gate dielectric material, which may refer to dielectric materials having a high dielectric constant that is greater than a dielectric constant of silicon oxide (k≈3.9). Exemplary high-k (HK) dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 140 has thickness of about 5 A to about 100 A. In some embodiments, the gate dielectric layer 140 may include a non-HK dielectric material such as silicon oxide. In some embodiments, the gate dielectric layer 140 includes more than one high-k dielectric layer, of which at least one includes dopants, such as lanthanum, magnesium, yttrium, or the like, which may be driven in by an annealing process to modify threshold voltage of the device 100.

In some embodiments, the gate dielectric layer 140 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 140 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

The nanostructures 114 may include gate spacers 144 and inner spacers 146 that are disposed on sidewalls of the gate dielectric layers 140. The inner spacers 146 are also disposed between the nanostructures 114 in the y-axis. Sidewalls of each of the gate structures 136 along the x-axis are separated by or spaced apart from the source/drain regions 116 and 150 by inner spacers 146. A material of the inner spacers 146 may be the same as a material of the gate spacers 144. In some embodiments, a dimension 216 between the source/drain regions 116 and 150 defines a channel length of the transistor in device 100.

In various embodiments, the source/drain contact 130 is formed by passing through the dielectric material 134 and the barrier layer 128, while being partially embedded into the source/drain region 116. In some embodiments, a recess in the source/drain region 116 is formed due to an over-etching of the barrier layer for forming the source/drain contact 130. The embedded portion of the source/drain contact 130 inside the source/drain region 116 increases a contact area between the conductive material of the source/drain contact 130 and the epitaxial structure of the source/drain region 116. The increased contact area results in a reduction of the contact resistance such as the $R_{csd}$ that introduced above. In some embodiments, the recess of the source/drain region 116 may have a dimension about 1-20 nm in the y-axis.

In some embodiments, a source/drain contact 152 is formed in contact with the source/drain region 150 in a similar way that is described for the source/drain contact 130. In an operation mode of the transistor in the device 100, one of the source/drain contacts 130, 152 may be coupled to an external circuit as a drain terminal (e.g., a voltage supply VDD), while another contact is coupled to the external circuit as a source terminal (e.g., a ground or low logical level voltage). In some embodiments, a portion of the barrier layer 128 remains between the source/drain contacts 130, 152 and the gate spacers 144. This remaining portion of the barrier layer 128 enhances an isolation between the source/drain contacts 130, 152 and the gate electrode 104. The remaining portion of the barrier layer 128 not only reduces the electrical leakage between the gate electrode 104 and the source/drain contacts 130, 152, but also increases a distance between the conductive material of the source/drain contacts 130, 152 and the gate electrode 104. The value of parasitic capacitance $C_{gd}$ reversely depends on the value of the distance between the conductive material. Thus, increasing the distance between the source/drain contacts 130, 152 causes a reduction of the parasitic capacitance such as $C_{gd}$.

The dielectric material 134 covers the top portion of the gate electrode 104 and the space between the source/drain contacts 130, 152. In some examples, a metal-to-gate (MG) contact may be formed on the gate electrode 104 passing through the dielectric material 134. In some embodiments, the conductive material of the source/drain contacts 130, 152 may be the same as a conductive material of the gate electrode 104 and the MG. In some examples, an external conductive feature may be coupled to each of the source/drain contacts 130, 152 and the gate electrode 104 through one or more conductive vias.

Figure 2A:
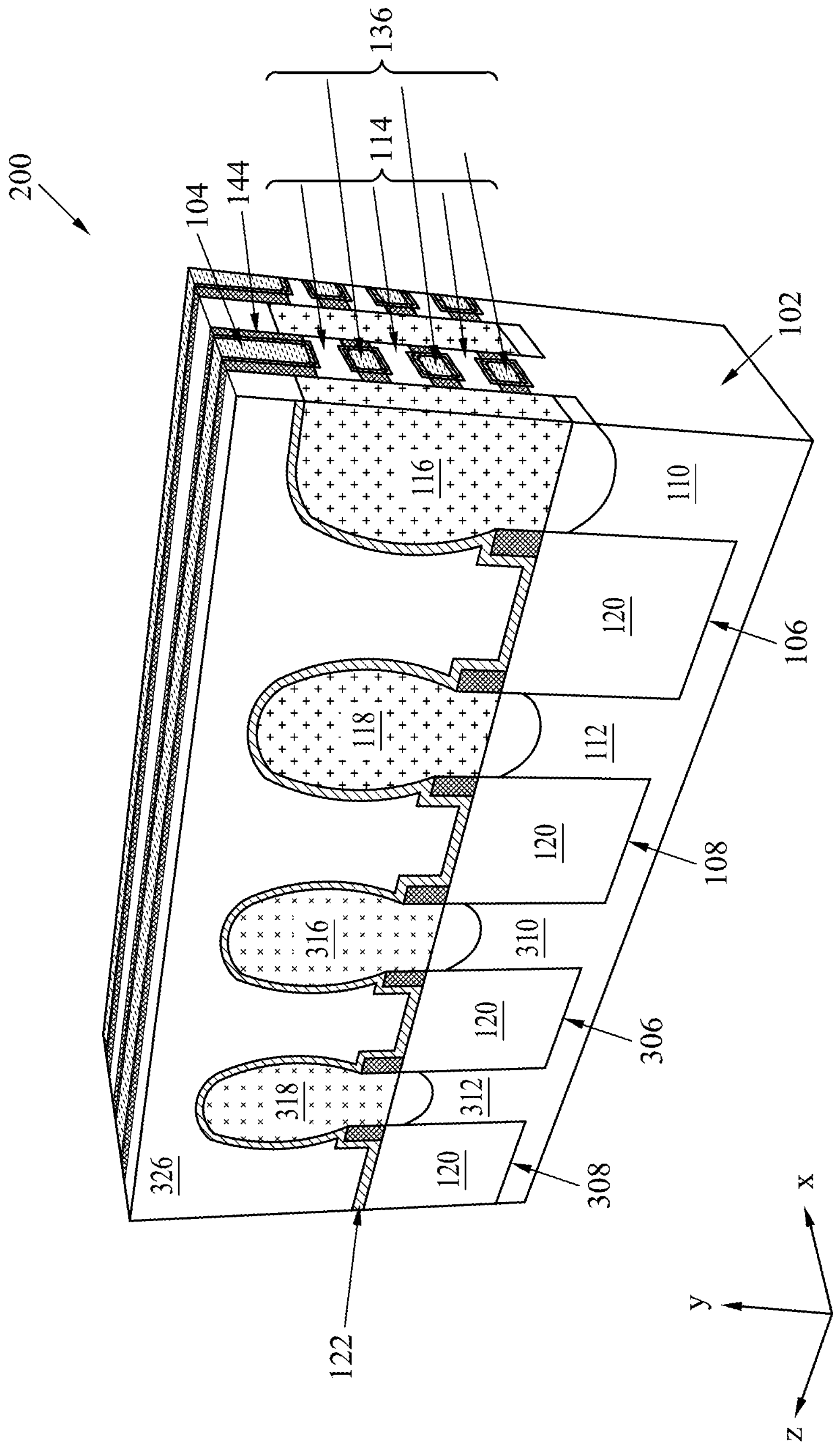
FIGS. 2A-2C are views illustrating a semiconductor device at various stages of manufacturing the semiconductor device in FIG. 1A, in accordance with some embodiments.
Figure 2B:
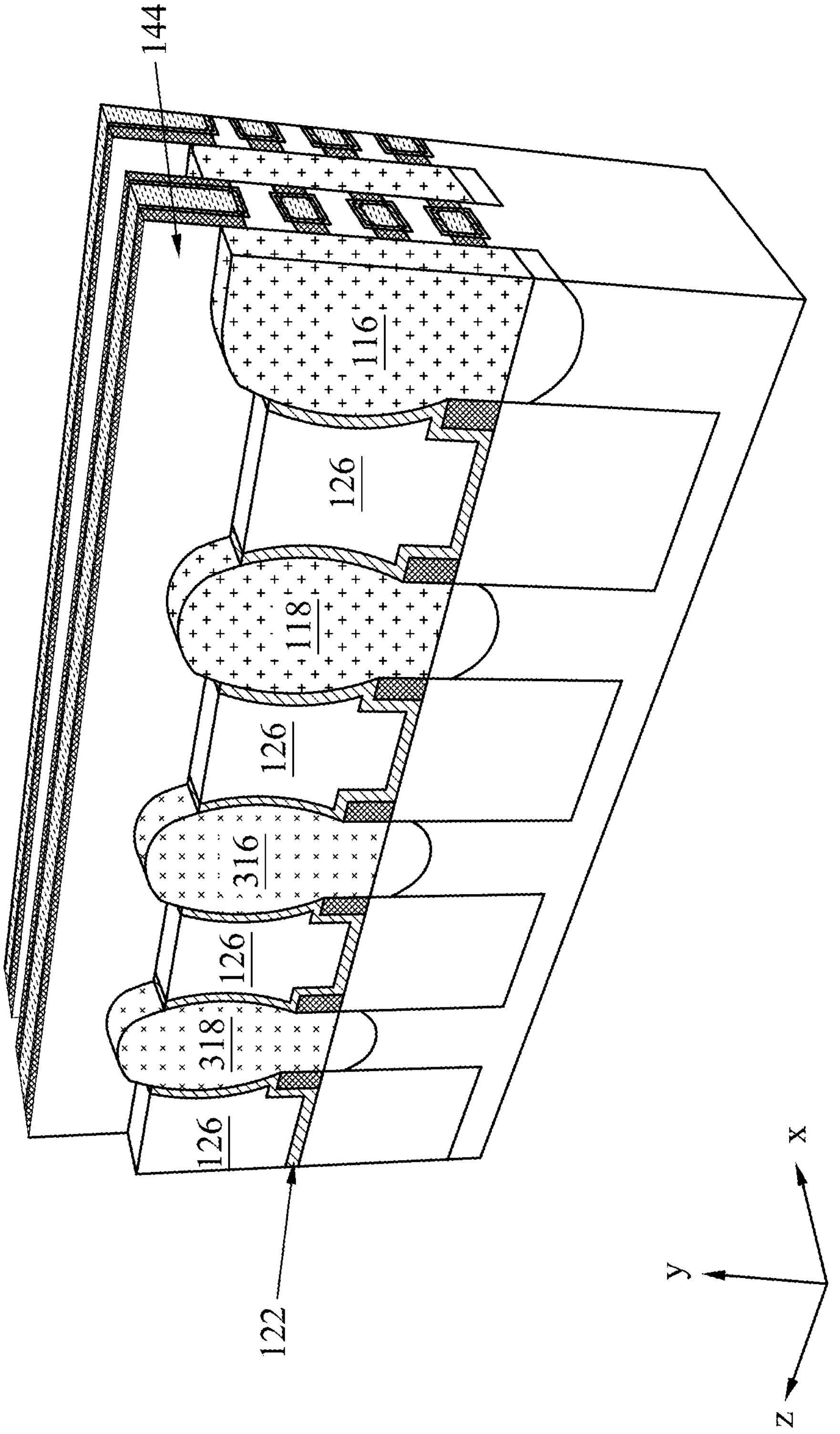
Figure 2C:
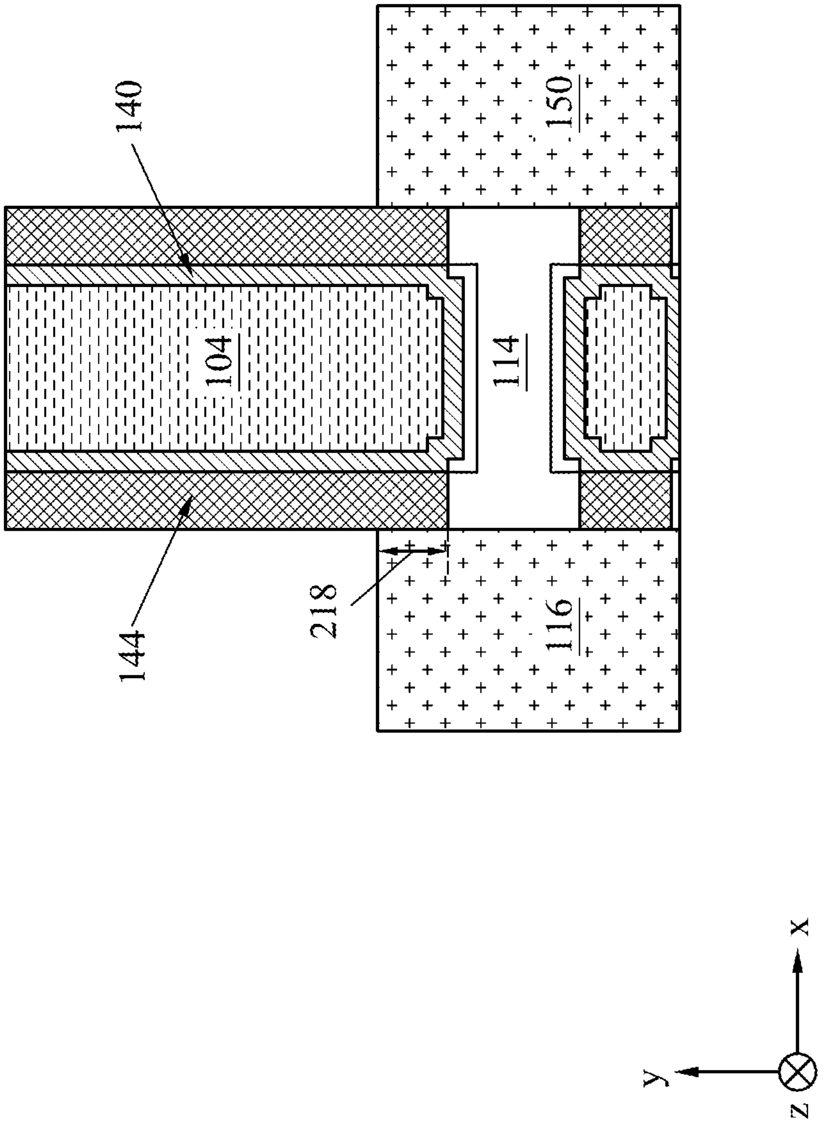

FIGS. 2A-2C are views illustrating a semiconductor device 200 at various stages of manufacturing the semiconductor device 100 described in FIGS. 1A and 1B. In this embodiment, some features are formed before the steps of FIG. 2A and are numbered the same as described in FIGS. 1A and 1B. The device 200 may be substantially the same as the device 100 in FIGS. 1A and 1B. In addition, the device 200 may include more features to form a digital circuit such as a static random access memory (SRAM).

FIG. 2A is an embodiment of the device 200 after forming a plurality of fin-like protruding portions 110, 112, 310, and 312 and trenches 106, 108, 306, and 308 in the substrate 102. The trenches 106, 108, 306, and 308 are partially filled with the dielectric material 120. Fin-like protruding portions 110, 112, 310, and 312 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

In various embodiments, the substrate 102 may be a semiconductor substrate, such as a bulk semiconductor, or the like, which may be doped (e.g., with a p-type or an n-type dopant) or undoped. The semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

For forming the nanostructures 114 and the gate structures 136 (that are described in FIGS. 1A and 1B), a multi-layer stack or "lattice" is formed over the substrate 102 of alternating layers of first semiconductor layers and second semiconductor layers (this step is prior to FIG. 2A that is not shown for simplicity). In some embodiments, the first semiconductor layers may be formed of a first semiconductor material suitable for n-type nano-FETs, such as silicon, silicon carbide, or the like, and the second semiconductor layers may be formed of a second semiconductor material suitable for p-type nano-FETs, such as silicon germanium or the like. Each of the layers of the multi-layer stack may be epitaxially grown using a process such as chemical vapor deposition (CVD), atomic layer deposition (ALD), vapor phase epitaxy (VPE), molecular beam epitaxy (MBE), or the like.

After forming the multi-layer stack, fin-like protruding portions 110, 112, 310, and 312 are formed in the substrate 102 and nanostructures 114 are formed in the multi-layer stack. In some embodiments, the nanostructures 114 and the fin-like protruding portions 110, 112, 310, and 312 may be formed by etching trenches in the multi-layer stack and the substrate 102. The etching may be any acceptable etch process, such as a reactive ion etch (RIE), neutral beam etch (NBE), or the like, or a combination thereof. The etching may be anisotropic. The etching process may include any suitable etching technique such as wet etching, dry etching, ashing, and/or other etching methods. In some examples, a dry etching process may implement an oxygen containing gas, a fluorine-containing gas (e.g., $CF_4$, $SF_6$, $CH_2F_2$, $CHF_3$, and/or $C_2F_6$), a chlorine-containing gas (e.g., $C1_2$, $CHC1_3$, $CC1_4$, and/or $BC1_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants.

In some embodiments, the multi-layer stack may include three semiconductor nanosheets that are stacked between sacrificial layers (e.g., SiGe). The sacrificial layers are later removed and replaced with the gate structures 136. Different numbers of the stacked semiconductor nanosheets and sacrificial layers may be designed based on the desired characteristics of the semiconductor devices. In some examples, the trenches 106, 108, 306, and 308 may be formed by an etching process. The stacked semiconductor nanosheets and sacrificial layers may be formed with different deposition techniques before the etching process.

Dielectric material 120, which may be shallow trench isolation (STI) regions, are formed adjacent the fin-like protruding portions 110, 112, 310, and 312. The dielectric material 120 may be formed by depositing an insulation material over the substrate 102 and between adjacent fin-like protruding portions 110, 112, 310, and 312 and nanostructures 114. The insulation material may be an oxide, such as silicon oxide, a nitride, the like, or a combination thereof, and may be formed by high-density plasma CVD (HDP-CVD), flowable CVD (FCVD), or the like, or a combination thereof. In some embodiments, a liner (not separately illustrated) may first be formed along surfaces of the substrate 102, the fin-like protruding portions 110, 112, 310, and 312, and the nanostructures 114. Thereafter, a fill material, such as those discussed above, may be formed over the liner.

The insulation material undergoes a removal process, such as a chemical mechanical polish (CMP), an etch-back process, combinations thereof, or the like, to remove excess insulation material over the nanostructures 114. Top surfaces of the nanostructures 114 may be exposed and level with the insulation material after the removal process is complete. In some embodiments, one or more hard mask layers is present over the nanostructures 114 to protect the nanostructures 114 during the removal process that removes the excess insulation material over the nanostructures 114. The hard mask layers may be exposed and level with the insulation material after the removal process is complete.

The insulation material is then recessed to form the dielectric material 120. After recessing, the nanostructures 114 and upper portions of the fin-like protruding portions 110, 112, 310, and 312 may protrude from between neighboring dielectric material 120. The dielectric material 120 may have top surfaces along the y-axis that are flat as illustrated, convex, concave, or a combination thereof. In some embodiments, the dielectric material 120 are recessed by an acceptable etching process, such as an oxide removal using, for example, dilute hydrofluoric acid (dHF), which is selective to the insulation material and leaves the fin-like protruding portions 110, 112, 310, and 312 and the nanostructures 114 substantially unaltered.

In some embodiments, the fin-like protruding portions 110, 112, 310, and 312 and/or the nanostructures 114 are epitaxially grown in trenches in a dielectric layer (e.g., etch first). The epitaxial structures may comprise the alternating semiconductor materials discussed above, such as the first semiconductor materials and the second semiconductor materials. Using masks, an n-type impurity implant may be performed in p-type regions of the substrate 102, and a p-type impurity implant may be performed in n-type regions of the substrate 102. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fin-like protruding portions 110, 112, 310, and 312 and the nanostructures 114 may obviate separate implantations, although in situ and implantation doping may be used together.

The fin-like protruding portions 110, 112, 310, and 312 and the nanostructures 114 may be patterned by any suitable method. For example, one or more photolithography processes, including double-patterning or multi-patterning processes, may be used to form the fin-like protruding portions 110, 112, 310, and 312 and the nanostructures 114. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin-like protruding portions 110, 112, 310, and 312.

In various embodiments, the epitaxially grown portions of the fin-like protruding portions 110, 112, 310, and 312 form source/drain regions 116, 118, 316, and 318. In this condition, the source/drain regions 116, 118 correspond to source/drain regions described in device 100 of FIGS. 1A and 1B, while the source/drain regions 316, 318 may form source/drain regions of an adjacent transistor to the transistor of the device 100 in FIGS. 1A and 1B. In this condition, the source/drain regions 116, 118 may include a different type of dopant than the source/drain regions 316, 318. For instance, the source/drain regions 116, 118 may be n-type doped epitaxial regions while the source/drain regions 316, 318 are p-type doped epitaxial regions.

Afterward, the liner 122 is formed on the dielectric material 120 and the source/drain regions 116, 118, 316, and 318. In addition, the liner 122 may cover sidewalls of the gate spacers 144 in the x-axis. The remaining portions of the trenches 106, 108, 306, 308 and the top portions of the fin-like protruding portions 110, 112, 310, and 312 in the y-axis are filled with a dielectric material 326 that is the basis of the first interlayer dielectric (ILD-0) which is described in FIG. 1A. The liner 122 may be formed by various processes, including a deposition process and an etching process. For instance, the deposition process may include thermal growth, CVD, PVD, and ALD. The deposition process may include depositing the liner 122 as a conformal layer. In this condition, a blanket layer includes silicon nitride and is deposited by a conformal deposition technique, such as an ALD process. In some examples, the etching process may include an anisotropic etch such as plasma etch. The anisotropic etch removes the majority of the horizontal portions of the blanket layer along the z-axis, while vertical portions of the blanket layer along the y-axis remain on the sidewalls of the source/drain regions 116, 118, 316, and 318.

In some examples, dielectric material 326 is formed over the liner 122 by a deposition process, such as CVD, PVD, ALD, HDPCVD, MOCVD, RPCVD, PECVD, LPCVD, ALCVD, APCVD, or combinations thereof. In some implementations, dielectric material 326 is formed by a flowable CVD (FCVD) process that includes, for example, depositing a flowable material (such as a liquid compound) over the liner 122 and converting the flowable material to a solid material by a suitable technique, such as thermal annealing and/or ultraviolet radiation treating. In some embodiments, after deposition of the dielectric material 326, the deposited dielectric material is thinned and planarized, for example, by a chemical mechanical polishing (CMP) process.

In some embodiments, gate spacers 144 are formed on first and second sidewalls of the gate electrode 104. The gate electrode 104 may be formed from a dummy gate that is enclosed between two gate spacers 144 along the x-axis. After forming the gate spacers 144, the dummy gate may be replaced by the conductive material of the gate electrode 104. In some examples, the gate spacers 144 are made of silicon nitride, silicon oxynitride, silicon carbide, another suitable material, or a combination thereof.

FIG. 2B is an etch-back process to remove upper portions of the liner 122 and a portion of dielectric material 326. In some examples, the etching process may include an anisotropic etch such as plasma etch. In some embodiments, the portions of the dielectric material 326 and the liner 122 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multi-step etching to gain etch selectivity, flexibility and desired etch profile. In some examples, a bias voltage of the plasma etching is controlled to selectively etch the portions of the dielectric material 326 and the liner 122 while the gate spacers 144 and the source/drain regions 116, 118, 316, and 318 remain undamaged.

In this embodiment, the remaining portion of the dielectric material 326 corresponds to the dielectric material 126 as the first interlayer dielectric (ILD-0) described in FIGS. 1A and 1B. In some embodiments, top portions of the source/drain regions 116, 118, 316, and 318 may be partially removed due to an over-etching of the dielectric material 326 and the liner 122. This over-etching causes some recessed portions in the epitaxial structure of the source/drain regions 116, 118, 316, and 318 to provide a contact area for the MD contact that is described in FIGS. 1A and 1B. However, the over-etching may be performed during another process in later steps.

FIG. 2C is a cross-sectional view of the embodiment in FIG. 2B. Portions of the embodiment in FIG. 2C correspond to the embodiment described in FIG. 1B. The source/drain regions 116, 150 are formed as partially covering the gate spacers 144. Portions of the gate spacers 144, as well as the gate electrode 104, are enclosed between the source/drain regions 116 and 150 with a dimension 218 in the y-axis. The rest of the gate spacers 144 in the y-axis are formed on the sidewalls of the gate dielectric layers 140 and the gate electrode 104. In this condition, the gate spacers 144 protect the gate dielectric layers 140 and the gate electrode 104 against etching and oxidation when exposed to the air.

Figure 3A:
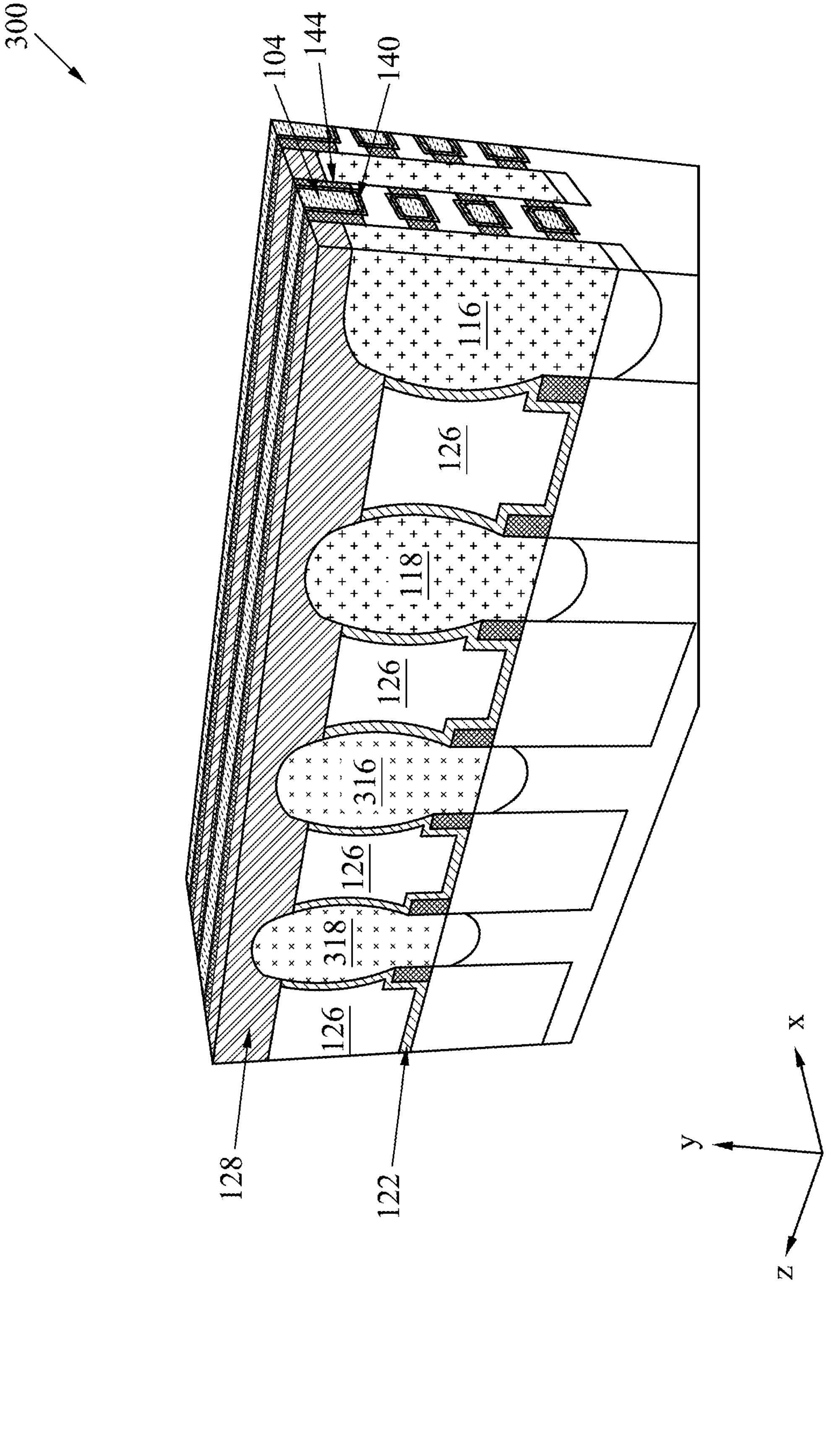
FIGS. 3A and 3B are views illustrating further processing of the semiconductor device for manufacturing the semiconductor device in FIG. 1A, in accordance with some embodiments.

FIG. 3A is a process of a device 300 covering the top portions of the dielectric material 126 with the barrier layer 128 described in FIGS. 1A and 1B. In various embodiments, the barrier layer 128 is formed by a deposition process, such as CVD, PVD, ALD, HDPCVD, MOCVD, RPCVD, PECVD, LPCVD, ALCVD, APCVD, or combinations thereof.

In some implementations, the barrier layer 128 is formed by a flowable CVD (FCVD) process that includes, for example, depositing a flowable material (such as a liquid compound) over the dielectric material 126 and the source/drain regions 116, 118, 316, and 318, and converting the flowable material to a solid material by a suitable technique, such as thermal annealing and/or ultraviolet radiation treating. In some embodiments, after deposition of the barrier layer 128, the deposited dielectric material, as well as the gate electrode 104 and the gate spacers 144, are thinned and planarized, for example, by a chemical mechanical polishing (CMP) process.

In some embodiments, the barrier layer 128 may include a low-k material such as SiOCN, SiON, SIN, SiCN, and SiOC. Alternatively, the barrier layer 128 may include aluminum silicate ($Al_ySiO_x$) or silicide material such as TiSi, TiNiSi, NiSi, WSi, CoSi, or the like. In some examples, the barrier layer 128 includes a dielectric of the metal or a dielectric of the silicide material, such as TiN, TiNiN, NiN, WN, CON, the like or TiSiN, TiNiSiN, NiSiN, WSiN, CoSiN, or the like. The dielectrics just described are nitrides of the metal or silicide material. In some embodiments, the barrier layer 128 includes carbon or oxygen. For example, barrier layer 128 may include TiSiON, TiCN, or the like. In some embodiments, thickness of the barrier layer 128 may be in a range of about 5 nm to about 100 nm in the y-axis.

Figure 3B:
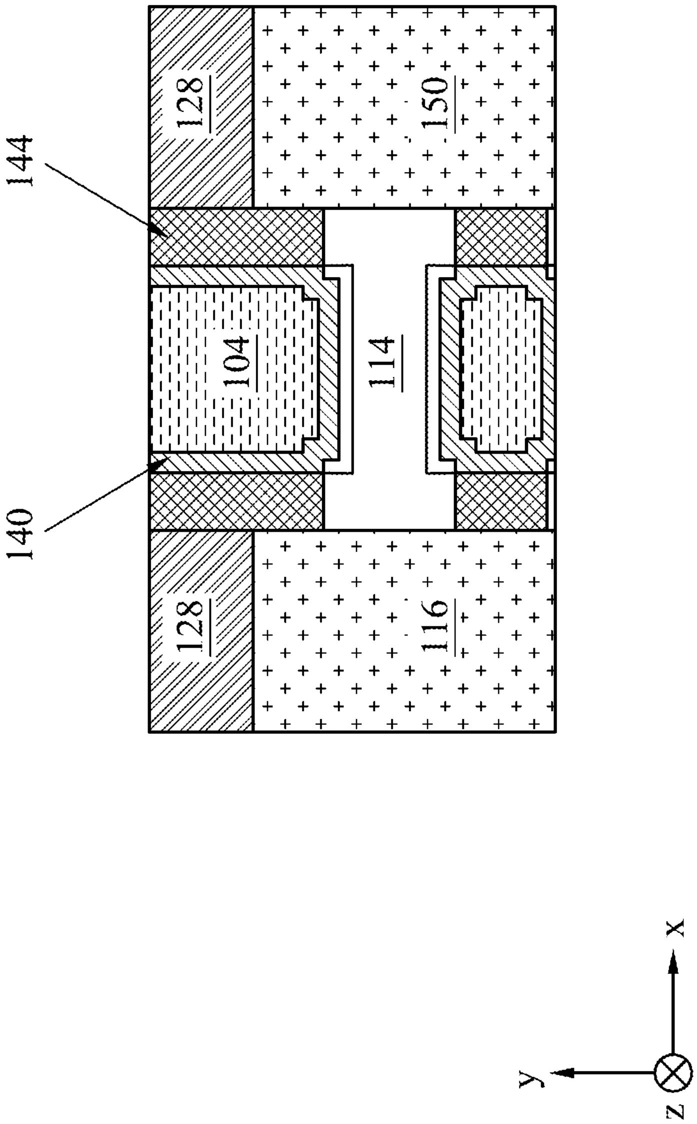

FIG. 3B is a cross-sectional view of the embodiment described in FIG. 3A. In this embodiment, sidewalls of the gate spacers 144 in the x-axis and top portions of the source/drain regions 116, 150 in the y-axis are covered by the barrier layer 128. After forming the barrier layer 128, top portions of the barrier layer 128, the gate electrode 104, the gate dielectric layers 140, and the gate spacers 144 in the y-axis are thinned and planarized, for example, by a chemical mechanical polishing (CMP) process.

Figure 4A:
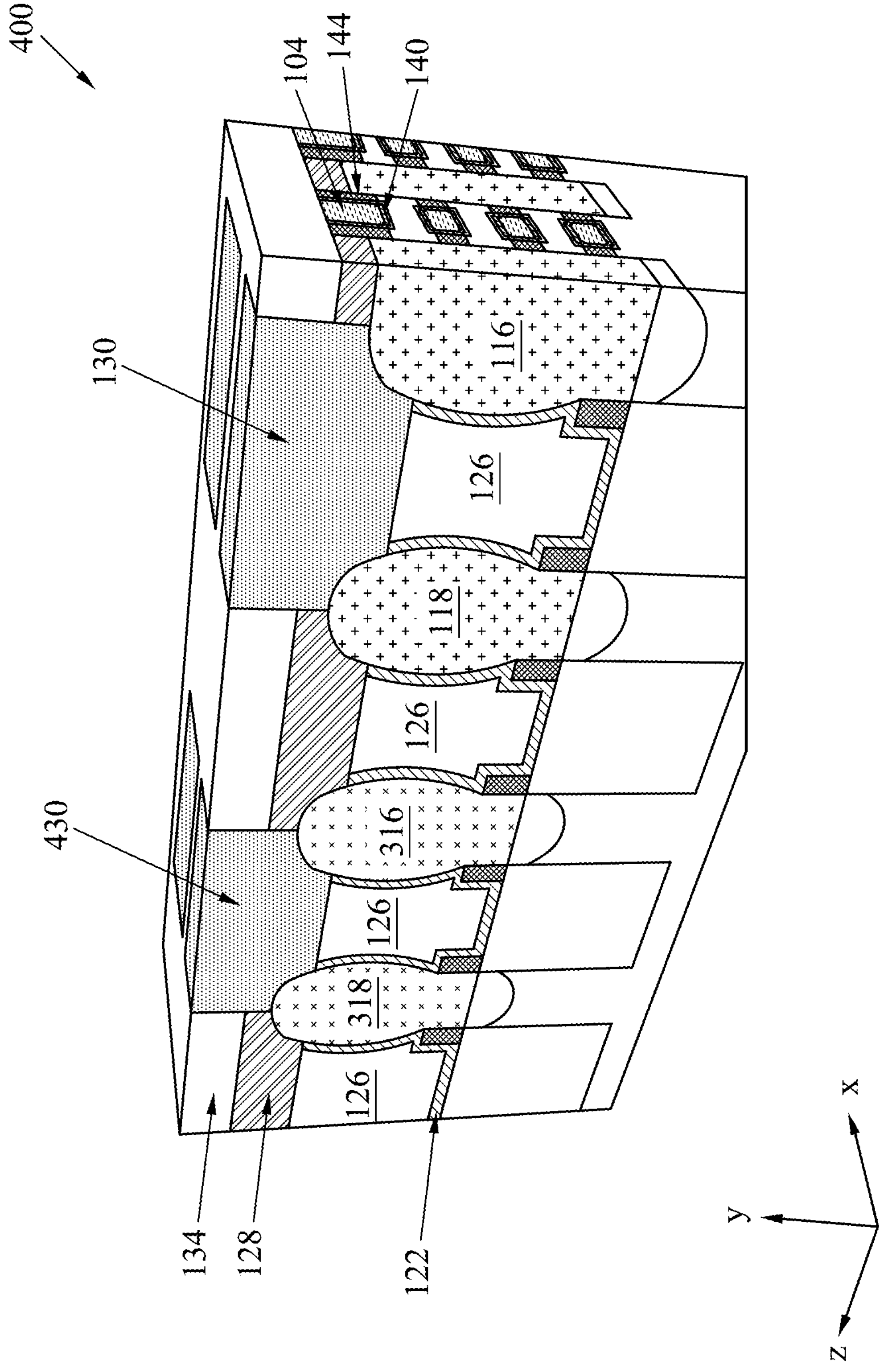
FIG. 4A is a three-dimensional view illustrating a semiconductor device, in accordance with some embodiments.

FIG. 4A is the embodiment of a semiconductor device 400 after forming the dielectric material 134 (as the ILD-1 that is described in FIGS. 1A and 1B) and source/drain contacts 130 and 430. A portion of the device 400 corresponds to the device 100 described in FIGS. 1A and 1B, while an additional transistor with a different type of source/drain regions 316, 318 is added to the device 100 in the z-axis. In various embodiments, more transistors may be added to the device 400 in both the z-axis and the x-axis. In various embodiments, the source/drain contacts 130 and 430 may be formed in straight vertical line in the z-axis and x-axis, or be formed in tapered structure in each of the z-axis and x-axis or both.

In this embodiment, the source drain contact 130 is partially in contact with the source/drain regions 116, 118 and the source/drain contact 430 is partially in contact with the source/drain regions 316, 318. Before forming the source/drain contacts 130, 430, the dielectric material 134 is formed on the barrier layer 128, the gate electrode 104, the gate dielectric layers 140, and the gate spacers 144 in the y-axis. In various embodiments, the dielectric material 134 is formed by a deposition process, such as CVD, PVD, ALD, HDPCVD, MOCVD, RPCVD, PECVD, LPCVD, ALCVD, APCVD, or combinations thereof. In some implementations, the dielectric material 134 is formed by a flowable CVD (FCVD) process that includes, for example, depositing a flowable material (such as a liquid compound) over the barrier layer 128, the gate electrode 104, the gate dielectric layers 140, and the gate spacers 144, and converting the flowable material to a solid material by a suitable technique, such as thermal annealing and/or ultraviolet radiation treating.

In some embodiments, the dielectric material 134 may include a low-k material such as SiOCN, SiON, SIN, SiCN, and SiOC. Alternatively, the dielectric material 134 may include aluminum silicate ($Al_ySiO_x$) or silicide material such as TiSi, TiNiSi, NiSi, WSi, CoSi, or the like. In some examples, the dielectric material 134 includes a dielectric of the metal or a dielectric of the silicide material, such as TiN, TiNiN, NiN, WN, CON, the like or TiSiN, TiNiSiN, NiSiN, WSiN, CoSiN, or the like. The dielectrics just described are nitrides of the metal or silicide material. In some embodiments, the dielectric material 134 includes carbon or oxygen. For example, dielectric material 134 may include TiSiON, TiCN, or the like. In some embodiments, thickness of the dielectric material 134 may be in a range of about 5 nm to about 100 nm in the y-axis.

After forming the dielectric material 134, positions of the source/drain contacts are patterned using one or more photolithography processes, including double-patterning or multi-patterning processes. After patterning, the openings are formed by etching the dielectric material 134 and the barrier layer 128. The etching may be any acceptable etch process, such as a reactive ion etch (RIE), neutral beam etch (NBE), the like, or a combination thereof. The etching may be anisotropic. The etching process may include any suitable etching technique such as wet etching, dry etching, ashing, and/or other etching methods. In some examples, a dry etching process may implement an oxygen containing gas, a fluorine-containing gas (e.g., $CF_4$, SF, CH, $F_2$, $CHF_3$, and/or $C_2F_6$), a chlorine-containing gas (e.g., $C1_2$, $CHC1_3$, $CC1_4$, and/or $BC1_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants.

The etching process may include a multi-step etching to gain etch selectivity, flexibility and desired etch profile. In some examples, a bias voltage of the plasma etching is controlled to selectively etch the portions of the dielectric material 134 and the barrier layer 128. In addition, a selective etching method may be used to selectively remove the dielectric material 134 and the barrier layer 128 in different steps. For instance, a first etching may be selective to the dielectric material 134 while the barrier layer 128 remains unchanged. In a next etching step, the etching is only selective to the barrier layer 128 (e.g., SiN) while the dielectric material 134 and 126 remain unchanged. Hence, the presence of the barrier layer 128 provides a boundary over the dielectric material 126 in the y-axis, in which the source/drain contacts 130, 430 stop at the boundary.

Figure 4B:
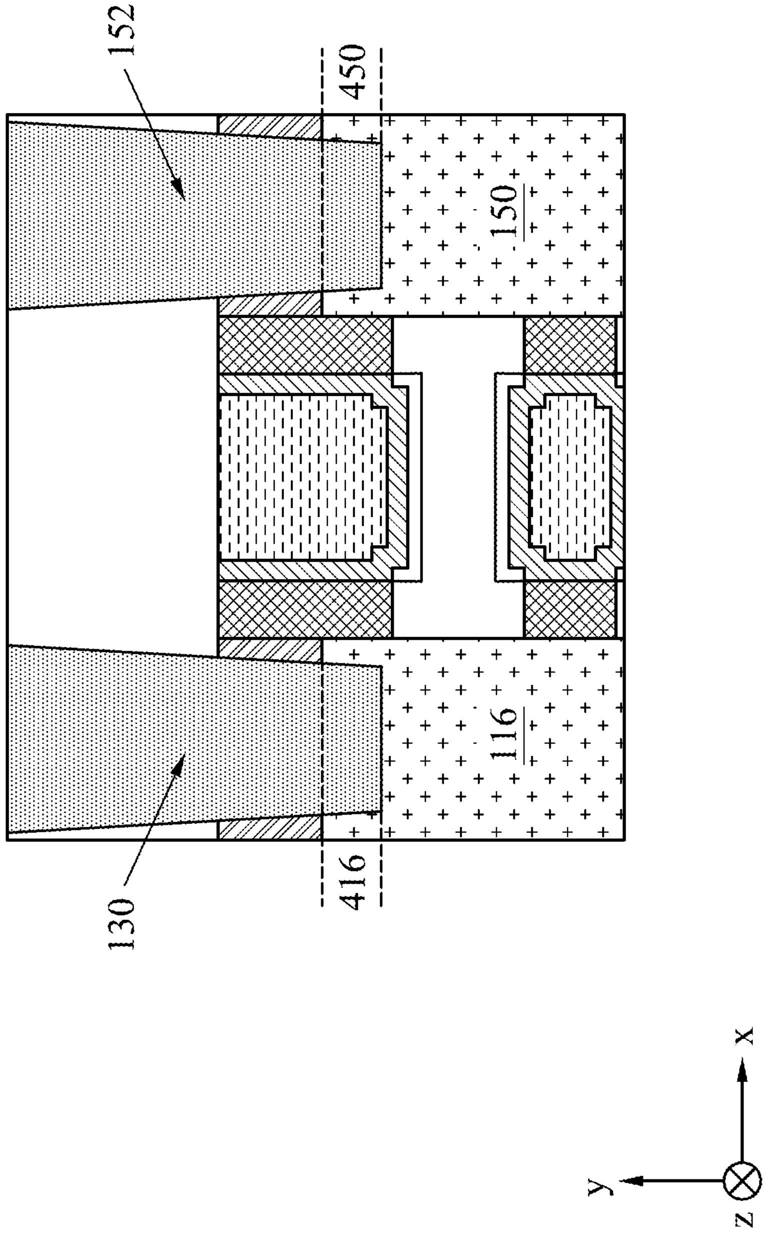
FIG. 4B is a cross-sectional view of the semiconductor device shown in FIG. 4A, in accordance with some embodiments.

In some embodiments, portions of the source/drain regions may be recessed during the etching of the barrier layer 128. FIG. 4B reproduces the embodiment of FIG. 1B and represents a cross-sectional view of the device 400 in FIG. 4A. In this embodiment, recessed portions 416, 450 of the source/drain regions 116, 150 are indicated by dotted lines visible in the y-axis. In some examples, the recesses 416, 450 may be formed in a separate etching process than the etching of the barrier layer 128. The recesses 416, 450 provide a greater area of the electrical contact between the source/drain contacts 130, 152 and the source/drain regions 116, 150. The greater area reduces the electrical resistance that is known as the contact resistance. The source/drain contacts 130, 152 are tapered in the x-axis, however, in various embodiments the source/drain contacts 130, 152 may be straight in one or more axes.

Figure 5:
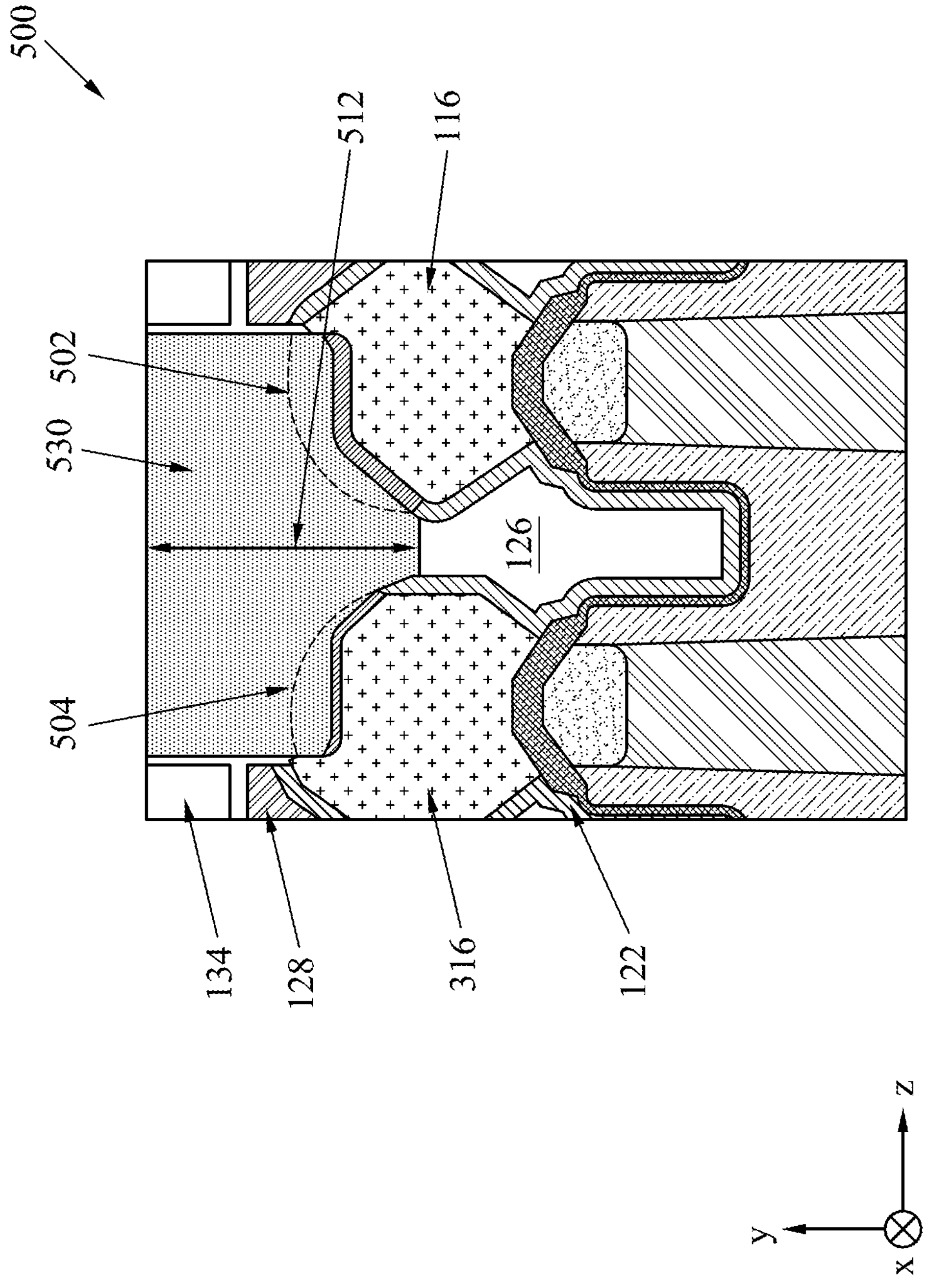
FIG. 5 is a cross-sectional view of a circuit based on the semiconductor device shown in FIG. 4A, in accordance with some embodiments.

In some embodiments, the source/drain contacts may be formed in partial contact with the source/drain regions in different devices. For instance, two different devices may be an n-type transistor and a p-type transistor. In this condition, an MD contact may be formed between the source/drain regions of two devices for a circuit such as an inverter. FIG. 5 shows an example of such a connection. Device 500 in FIG. 5 may be the same as the device 400 with the only difference being the MD contact connection. In this condition, the source/drain regions 116, 316 described in FIG. 4A are coupled together with an MD contact 530. Other features of the device 500 (e.g., the barrier layer 128 and the dielectric material 134) may be the same as the device 400 described in FIG. 4A. In this example, the portions 502, 504 of the source/drain regions 116, 316 are recessed in the y-axis. The recessed portions 502, 504, that are represented with dashed lines, are filled (either partially or fully) with the conductive material of the MD contact 530. In addition, a portion of the dielectric material 126 may be recessed in the y-axis due to an over-etching of the barrier layer 128. In some embodiments, the recess of the dielectric material 126 may be formed to enlarge the area of the connection between the MD contact 530 and the source/drain regions 116, 316. The recess of the dielectric material 126 in the y-axis results in increasing a height 512 of the MD contact 530 in the y-axis. In some examples, an under-etching may cause a revers effect by reducing the height 512 in the y-axis. The under-etching of the barrier layer 128 resulting in a thin layer of the barrier layer 128 remaining between the MD contact 530 and the dielectric material 126 in the y-axis.

Figure 6:
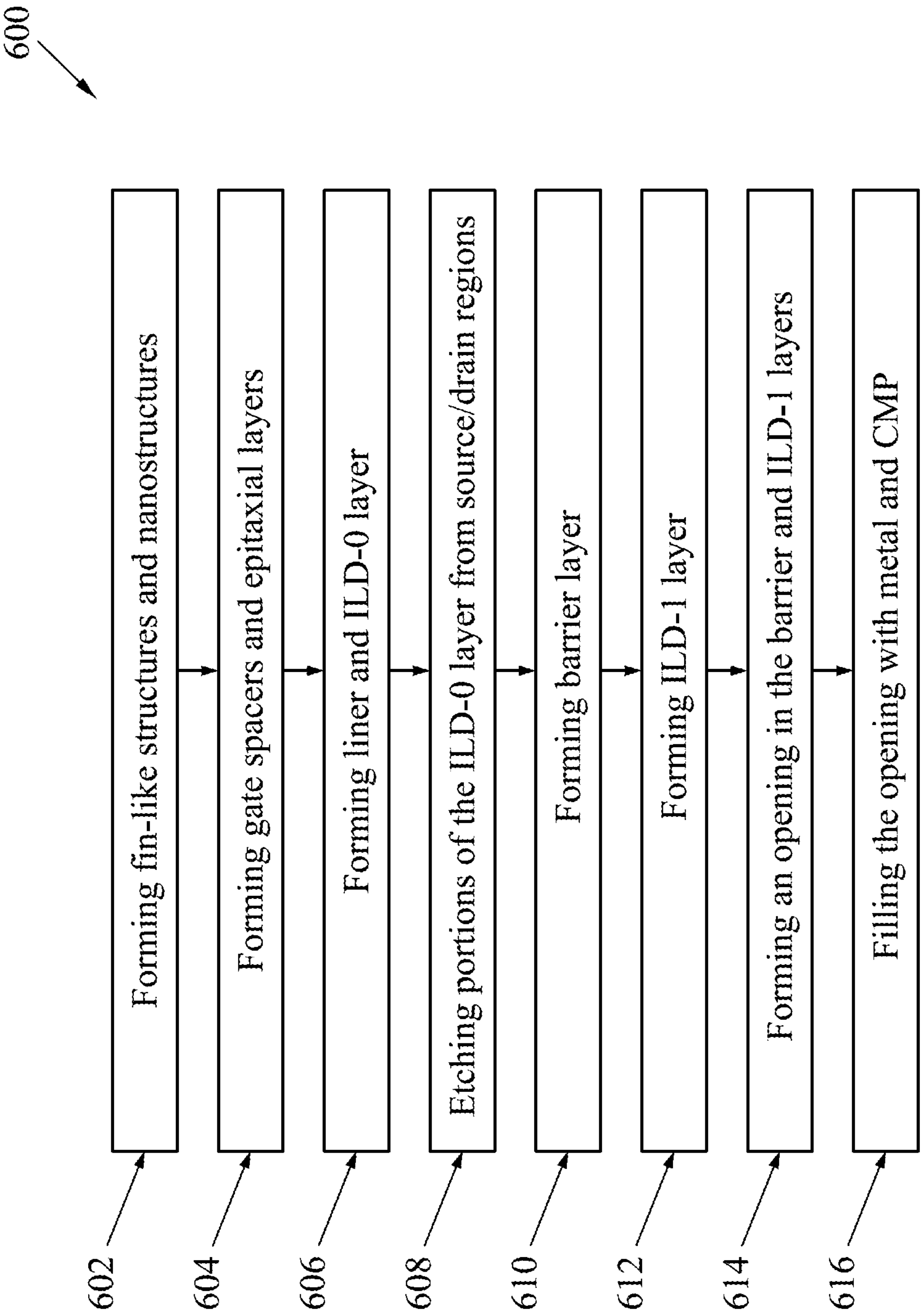
FIG. 6 is a flowchart schematically illustrating a process of forming a semiconductor device, in accordance with some embodiments.

FIG. 6 is a flowchart 600 of the process described in the embodiments of FIGS. 2A-4B. At 602, fin-like protruding portions 110, 112, 310, and 312 and nanostructures 114 of FIG. 2A are formed by the techniques that are described in FIG. 2A. At 604, gate spacers 144 as well as source/drain regions 116, 118, 316, and 318 are formed by techniques that are described in FIG. 2A. At 606, the liner 122 and dielectric material 326 are formed as described in FIG. 2A. At 608, portions of the dielectric material 326 are etched until a portion of the source drain regions form the dielectric material 126 as described in FIG. 2B. At 610, the barrier layer 128 is formed on the dielectric material 126 and the source/drain regions 116, 118, 316, and 318, as described in FIG. 3A. At 612, the dielectric material 134 is formed on the barrier layer 128, the gate electrode 104, the gate dielectric layers 140, and the gate spacers 144 as described in FIG. 4A. At 614, openings for the source/drain contacts are formed in the barrier layer 128 and the dielectric material 134 as described in FIG. 4A. At 616, the openings are filled with conductive material to form the source/drain contacts 130, 430 as described in FIG. 4A. Afterward, a chemical mechanical polishing (CMP) may be used to planarize the contact and the dielectric material. In various embodiments, the order of the steps may be changed and/or the process of each step may be different than the process described in the embodiments of FIGS. 2A-4B.

In accordance with at least one embodiment, a semiconductor device, comprising: a substrate, a vertical stack of nanostructure channels overlying the substrate; a gate structure wrapping around the nanostructure channels; source/drain regions on the substrate laterally adjacent and electrically coupled to the nanostructure channels in a first direction; a first dielectric layer at least partially filling spaces between the source/drain regions in a second direction transverse to the first direction; a second dielectric layer over the first dielectric layer and partially covering the source/drain regions in a third direction transvers to the first and second directions; a source/drain contact partially coupled to the source/drain regions, the source/drain contact being in contact with the second dielectric layer in the second direction and in contact with the first dielectric layer in the third direction; and a third dielectric layer on the second dielectric layer and in contact with the source/drain contact in the first and second directions.

In accordance with at least one embodiment, a method, comprising: forming a vertical stack of nanostructure channels overlying a substrate; forming source/drain regions on the substrate laterally adjacent and electrically coupled to the nanostructure channels in a first direction; forming a gate structure wrapping around the nanostructure channels; forming a first dielectric layer between the source/drain regions in a second direction transverse to the first direction, the first dielectric layer covering the source/drain regions in a third direction; forming a first opening that exposes portions of the source/drain regions by partially removing the first dielectric layer from the source/drain regions in the third direction; forming a second dielectric layer in the first opening; forming a third dielectric layer on the second dielectric layer in the third direction; forming a second opening in the second and third dielectric layers, the second opening exposing respective portions of the source/drain regions in the third direction; and forming a source/drain contact in the second opening, the source/drain contact being partially coupled to the source/drain regions.

In accordance with at least one embodiment, a method, comprising: forming a first transistor including a first vertical stack of nanostructures, first source/drain regions, and first gate; forming a second transistor including a second vertical stack of nanostructures, second source/drain regions, and second gate; forming an etch stop layer on the first and second source/drain regions; forming a first dielectric layer between and on the first and second source/drain regions; forming a first opening that exposes the first and second source/drain regions; forming a second dielectric layer in the first opening; forming a third dielectric layer on the second dielectric layer; and forming a source/drain contact that extends through the first and second dielectric layers and lands on the first and second source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a vertical stack of nanostructure channels overlying a substrate;

forming source/drain regions on the substrate laterally adjacent and electrically coupled to the nanostructure channels in a first direction;

forming a gate structure wrapping around the nanostructure channels, the gate structure extending in a second direction different to the first direction;

forming a first dielectric layer over the source/drain regions, the first dielectric layer covering the source/drain regions in a third direction;

forming a first opening that exposes portions of the source/drain regions by partially removing the first dielectric layer from the source/drain regions in the third direction;

forming a second dielectric layer in the first opening, the second dielectric layer contacting opposing sidewall surfaces of the source/drain regions in the second direction;

forming a third dielectric layer on the second dielectric layer in the third direction;

forming a second opening in the second and third dielectric layers, the second opening exposing a portion of one of the source/drain regions in the third direction; and forming a source/drain contact in the second opening, the source/drain contact being partially coupled to the one of the source/drain regions.

2. The method of claim 1, wherein forming the second opening forms a recess in the one of the source/drain regions.

3. The method of claim 2, wherein forming the second opening results in over-etching the first dielectric layer that causes a recess of the first dielectric layer in the third direction, and the source/drain contact has a height that is greater than total height of the second dielectric layer and the third dielectric layer.

4. The method of claim 3, wherein forming the second opening includes multi-step etching, wherein a first etching is selective to the third dielectric layer and a second etching is selective to the second dielectric layer.

5. The method of claim 2, wherein the forming of the second opening includes an etching of the second dielectric layer that stops at the first dielectric layer.

6. The method of claim 5, wherein etching of the second dielectric layer includes an under-etching, the under-etching resulting in a thin layer of the second dielectric layer remaining between the source/drain contact and the first dielectric layer in the third direction.

7. A method, comprising:

forming a first vertical stack of nanostructures and a first source/drain region adjacent to the first vertical stack of the nanostructures;

forming a second vertical stack of nanostructures and a second source/drain region adjacent to the second vertical stack of the nanostructures;

forming a gate structure wrapping around the first vertical stack of the nanostructures and the second vertical stack of the nanostructures;

forming an etch stop layer on the first and second source/drain regions;

forming a first dielectric layer between and on the first and second source/drain regions;

forming a first opening that exposes the first and second source/drain regions;

forming a second dielectric layer in the first opening;

forming a third dielectric layer on the second dielectric layer; and forming a source/drain contact that extends through the third and second dielectric layers and lands on the first and second source/drain regions and a portion of the first dielectric layer between the first and second source/drain regions.

8. The method of claim 7, wherein forming the source/drain contact includes forming a second opening by:

selectively etching the third dielectric layer with a first anisotropic etching; and selectively etching the second dielectric layer with a second anisotropic etching through etched portions of the third dielectric layer.

9. The method of claim 8, wherein forming the second opening results in over-etching the first dielectric layer that causes a recess of the first dielectric layer, and the source/drain contact has a height that is greater than total height of the second dielectric layer and the third dielectric layer.

10. The method of claim 8, wherein forming the source/drain contact includes:

depositing a conductive material in the second opening, the conductive material vertically stopping at the second dielectric layer; and planarizing the conductive material and the third dielectric layer by a chemical mechanical polishing (CMP) technique.

11. The method of claim 7, wherein the source/drain contact is coplanar with a combination of the third and second dielectric layers.

12. A method, comprising:

forming a vertical stack of nanostructure channels overlying a substrate;

forming source/drain regions on the substrate laterally adjacent and electrically coupled to the nanostructure channels in a first direction;

forming a gate structure wrapping around the nanostructure channels, the gate structure extending in a second direction different to the first direction;

forming a first dielectric layer over the source/drain regions and laterally surrounding the gate structure, the first dielectric layer having a top surface coplanar with a top surface of the gate structure;

recessing a portion of the first dielectric layer to expose upper portions of the source/drain regions;

forming a second dielectric layer on the recessed portion of the first dielectric layer and partially covering the source/drain regions in a third direction transverse to the first and second directions, the second dielectric layer having a top surface coplanar with the top surface of the gate structure;

forming a third dielectric layer on the second dielectric layer; and forming source/drain contacts extending through the third and second dielectric layers to contact the respective source/drain regions.

13. The method of claim 12, wherein forming the source/drain contacts include forming openings in the third and second dielectric layers to expose respective portions of the source/drain regions.

14. The method of claim 13, wherein forming the openings forms respective recesses in the source/drain regions.

15. The method of claim 14, wherein forming the openings results in over-etching the first dielectric layer that causes a recess of the first dielectric layer in the third direction, and the source/drain contact has a height that is greater than a total height of the second dielectric layer and the third dielectric layer.

16. The method of claim 13, wherein forming the openings includes multi-step etching, wherein a first etching is selective to the third dielectric layer and a second etching is selective to the second dielectric layer.

17. The method of claim 13, wherein forming the openings includes an etching of the second dielectric layer that stops at the first dielectric layer.

18. The method of claim 17, wherein etching of the second dielectric layer includes under-etching, the under-etching resulting in a thin layer of the second dielectric layer remaining between the source/drain contact and the first dielectric layer in the third direction.

19. The method of claim 12, wherein forming the source/drain contacts includes forming openings by:

selectively etching the third dielectric layer with a first anisotropic etching; and selectively etching the second dielectric layer with a second anisotropic etching through etched portions of the third dielectric layer.

20. The method of claim 19, wherein forming the source/drain contacts includes:

depositing a conductive material in the openings, the conductive material vertically stopping at the second dielectric layer; and planarizing the conductive material and the third dielectric layer by a chemical mechanical polishing (CMP) technique.

* * * * *